United States Patent
Chen et al.

(10) Patent No.: US 8,990,275 B2
(45) Date of Patent: Mar. 24, 2015

(54) METHOD FOR ENCODING FLOATING-POINT DATA, METHOD FOR DECODING FLOATING-POINT DATA, AND CORRESPONDING ENCODER AND DECODER

(75) Inventors: Qu Qing Chen, Beijing (CN); Tong Zhou, Beijing (CN); Zhi Bo Chen, Beijing (CN)

(73) Assignee: Thomson Licensing, Issy les Moulineaux (FR)

( * ) Notice: Subject to any disclaimer, the term of this patent is extended or adjusted under 35 U.S.C. 154(b) by 388 days.

(21) Appl. No.: 13/394,158

(22) PCT Filed: Sep. 9, 2010

(86) PCT No.: PCT/EP2010/063245
§ 371 (c)(1),
(2), (4) Date: Mar. 5, 2012

(87) PCT Pub. No.: WO2011/029876
PCT Pub. Date: Mar. 17, 2011

(65) Prior Publication Data
US 2012/0166510 A1    Jun. 28, 2012

(30) Foreign Application Priority Data
Sep. 14, 2009  (EP) .................................... 09305843

(51) Int. Cl.
*G06F 7/00* (2006.01)
*G06T 9/00* (2006.01)
(Continued)

(52) U.S. Cl.
CPC .................. *G06T 9/001* (2013.01); *H03M 7/24* (2013.01); *H03M 7/30* (2013.01); *H04N 19/50* (2014.01); *H04N 19/70* (2014.01); *H04N 19/61* (2014.01); *H04N 19/423* (2014.01)
USPC ........................................................ 708/203

(58) Field of Classification Search
None
See application file for complete search history.

(56) References Cited

U.S. PATENT DOCUMENTS 6,125,201 A    9/2000  Zador
6,175,369 B1   1/2001  Dyer et al.
(Continued)

FOREIGN PATENT DOCUMENTS

CA    2229245    8/1999
CA    2372969    8/2002
(Continued)

OTHER PUBLICATIONS

Deering, "Geometry Compression," Computer Graphics Proceedings, Annual Conference Series, Los Angeles, CA, Aug. 6-11, 1995, IEEE published Aug. 6, 1995, pp. 13-20.
(Continued)

*Primary Examiner* — David H Malzahn
(74) *Attorney, Agent, or Firm* — Robert D. Shedd; Ronald J. Kolczynski

(57) ABSTRACT

An algorithm for efficiently compressing floating-point data in 3D meshes is disclosed. 3D meshes are represented by topology data, geometry data and property data. Geometry data specify vertex locations and are usually represented by floating-point coordinates. While geometry data are usually compressed by quantization, prediction and entropy coding, the present invention uses no prediction. A floating-point number consists of mantissa and exponent, and normally the exponent, sign and mantissa are compressed separately. A method for encoding floating-point formatted data comprises determining if a current floating-point value was previously stored in a memory, storing the current value in the memory if it was not previously stored in the memory, and encoding it. Otherwise, if the current floating-point value was previously stored in a memory, the storage position of the value within the memory is determined and a reference pointing to the storage position is encoded.

26 Claims, 3 Drawing Sheets

(51) Int. Cl.
  *H03M 7/24* (2006.01)
  *H03M 7/30* (2006.01)
  *H04N 19/50* (2014.01)
  *H04N 19/70* (2014.01)
  *H04N 19/61* (2014.01)
  *H04N 19/423* (2014.01)

(56) References Cited

U.S. PATENT DOCUMENTS

| | | | |
|---|---|---|---|
| 6,737,997 | B2 | 5/2004 | Sakaguchi |
| 7,071,935 | B1 | 7/2006 | Deering et al. |
| 7,324,115 | B2 | 1/2008 | Fraser |
| 8,653,991 | B2 | 2/2014 | Harada et al. |
| 2001/0050682 | A1 | 12/2001 | Deering et al. |
| 2002/0122035 | A1 | 9/2002 | Ng |
| 2012/0166510 | A1* | 6/2012 | Chen et al. ............. 708/512 |
| 2013/0007076 | A1* | 1/2013 | Wegener ............. 708/203 |
| 2013/0007078 | A1* | 1/2013 | Wegener ............. 708/203 |
| 2013/0054661 | A1* | 2/2013 | Wegener ............. 708/203 |

FOREIGN PATENT DOCUMENTS

| | | |
|---|---|---|
| EP | 964364 | 12/1999 |
| EP | 1351195 | 10/2003 |
| JP | H09134437 | 5/1997 |
| JP | H10190476 | 7/1998 |
| JP | 2003296747 | 10/2003 |
| JP | 2004023526 | 1/2004 |
| JP | 2006129357 | 5/2006 |
| JP | 2009075326 | 6/2009 |
| WO | 9939308 | 8/1999 |
| WO | WO2009072571 | 6/2009 |

OTHER PUBLICATIONS

Isenburg et al., "Lossless Compression of Predicted Floating-point Geometry," Computer Aided Design, Elsevier Publishers BV, Barking, GB, vol. 37, No. 8, Jul. 1, 2005, pp. 869-877.

Taubin et al., "Geometric Coding and VRML," Joint Video Team (JVT), ISO/IEC JTC1/SC29/WG11, MPEG97/M3061 Proposal, presented Feb. 1997, San Jose, CA, published Jan. 23, 1998, 17 pages.

Li et al., "Dynamic Extended Codebook Based Vector Quantization Scheme for Mesh Geometry Compression," Third Int'l. Conference on Intelligent Information Hiding and Multimedia Signal Processing, 2007 (IIHMSP 2007), IEEE, NJ, USA Nov. 26, 2007, pp. 178-181.

Search Report dated Oct. 28, 2010.

* cited by examiner

US 8,990,275 B2

METHOD FOR ENCODING FLOATING-POINT DATA, METHOD FOR DECODING FLOATING-POINT DATA, AND CORRESPONDING ENCODER AND DECODER

This application claims the benefit, under 35 U.S.C. §365 of International Application PCT/EP2010/063245, filed Sep. 9, 2010, which was published in accordance with PCT Article 21(2) on Mar. 17, 2011 in English and which claims the benefit of European patent application No. 09305843.6, filed Sep. 14, 2009.

FIELD OF THE INVENTION

This invention relates to a method for encoding floating-point data and a method for decoding floating-point data, and corresponding encoder and decoder.

BACKGROUND

Floating-point describes a system for numerical representation in which a string of digits (or bits) represents a rational number. There are several different floating-point representations used in computers. The most commonly encountered representation is the one defined in the IEEE 754 standard. The main advantage of floating-point representation over fixed-point and integer representation is that it can support a much wider range of values. A fixed-point representation that has seven decimal digits, with the decimal point assumed to be positioned after the $5^{th}$ digit, can e.g. represent the numbers 12345.67, 8765.43, 123.00 etc., whereas a floating-point representation such as the IEEE 754 decimal32 format with seven decimal digits can additionally represent e.g. 0.00001234567, 123456700000, 1.234567, 123456.7 etc. The floating-point format needs only slightly more storage, since it needs to encode the position of the radix point.

Floating-point representation is similar in concept to scientific notation. Logically a floating-point number consists of mantissa and exponent. Mantissa is a signed digit string of a given length in a given base (or radix). It is also called "significand" or just "coefficient". The radix point is not explicitly included, but is implicitly assumed to lie always in a certain position within the significand, often just after or just before the most significant digit, or to the right of the rightmost digit. Conventionally, the radix point is just after the most significant (leftmost) digit. The length of the significand determines the precision.

Exponent is a signed integer exponent also referred to as the characteristic or scale, which modifies the magnitude of the number.

Floating-point numbers are typically packed into a computer datum as sign bit, exponent field, and significand (also called mantissa), from left to right. For the IEEE 754 binary formats they are apportioned as follows:

TABLE 1

IEEE 754 binary formats for floating-point data

| Type | Sign | Exponent | Exponent bias | Significand | total |
|---|---|---|---|---|---|
| Half (IEEE 754r) | 1 | 5 | 15 | 10 | 16 |
| Single | 1 | 8 | 127 | 23 | 32 |
| Double | 1 | 11 | 1023 | 52 | 64 |
| Quad | 1 | 15 | 16383 | 112 | 128 |

When a binary number is normalized, the leftmost bit of the significand is known to be 1. In the IEEE binary interchange formats, this bit is not actually stored in the computer datum. It is called the "hidden" or "implicit" bit. Because of this, single precision format actually has a significand with 24 bits of precision, double precision format has 53, and quad has 113. For example, a floating-point datum may consist of (from left to right, or most significant bit MSB to least significant bit LSB) 1 bit sign, 8 bits exponent and 23 bits mantissa. Since also the exponent may be negative, it is added with a bias of 127. E.g., a floating-point value may have the values: sign=0; e=1; s=1100.1001.0000.1111.1101.1011 (including the hidden bit). The sum of the exponent bias and the exponent is 128, so this is represented in single precision format as 0100.0000.0100.1001.0000.1111.1101.1011 (excluding the hidden bit), or 40490FDB as a hexadecimal number.

Further, 3D meshes are widely used in various applications to represent 3D objects. Their raw representation usually requires a huge amount of data, while most applications demand compact representation of 3D meshes for storage and transmission. Therefore, many algorithms for efficiently compressing 3D meshes have been proposed. Typically, 3D meshes are represented by three types of data: Topology data (also called connectivity data), which describe the adjacency relationship between vertices, geometry data, which specify vertex locations, and property data, which specify attributes such as the normal vector, material reflectance and texture coordinates. Most widely-used 3D compression algorithms compress topology data and geometry data separately. The coding order of geometry data is determined by the underlying topology coding. Geometry data is usually compressed by three main steps: quantization, prediction and entropy coding. 3D mesh property data are usually compressed by a similar method as geometry compression.

Texture coordinates are used for assigning texture image positions to vertices. That is, texture coordinates determine how pixels in the texture are mapped to the surface of a triangle in object space, as shown in FIG. 1. The per-vertex assignment of texture coordinates is the key to mapping a texture image to rendered geometry. In 3D mesh coding, each vertex has a texture coordinate group (x,y), which consists of floating-point data. The coordinates are normalized to a range of [0, . . . , 1]. A conventional compression method for floating-point texture coordinates can be described as normalization, prediction and residue encoding. For prediction, various prediction schemes are known to get a prediction value of texture coordinates, e.g. parallelogram prediction. This scheme is also widely used for geometry data prediction. The resulting residue is a floating-point value that comprises exponent, sign and mantissa. If the floating point value is too small, e.g. smaller than $2^{-12}$, then it can usually be treated as zero. If it is bigger than a threshold, then further compression is done.

Normally, exponent, sign and mantissa are compressed separately. For each of them, a context based coding scheme as well as arithmetic coding (e.g. range encoder) can be employed. A conventional compression scheme can be found in "Lossless Compression of Floating-Point Geometry" by Martin Isenburg, Peter Lindstrom and Jack Snoeyink, Proceedings of CAD'3D, May 2004. Revised journal version in Computer-Aided Design, Volume 37, Issue 8, pages 869-877, July 2005.

SUMMARY OF THE INVENTION

The present invention is based on the recognition of the fact that traditional floating-point data coding schemes may not fully exploit the redundancy included in texture coordinates. Although the disclosed entropy coding method is specifically designed for the compression of texture coordinates of 3D mesh data, it can be applied in principle also to other applications that need to compress floating-point data.

According to one aspect of the invention, a method for encoding floating-point formatted data (in a floating-point format that comprises at least an exponent and a mantissa) comprises steps of determining if a current floating-point formatted data value was previously stored in a memory of predefined size, storing the current floating-point formatted data value in the memory if it was not previously stored in said memory, and encoding it. Otherwise (it was already previously stored in said memory), determining the storage position of said value within the memory, and encoding a reference pointing to the storage position.

In one embodiment, separate memories are used for different exponents, and each of the memories has predefined size and is associated with an exponent. The memories do not explicitly store exponents, but only mantissa values or mantissa and sign values. In this embodiment, the steps of determining if a current value was previously stored in a memory, storing the value in the memory and determining the storage position refer only to the memory that is associated with the exponent of said current floating-point formatted data value and refer to mantissa, or to mantissa and sign. The method of this embodiment may further comprise determining the memory that is associated with the current exponent, and encoding the exponent, an indication of the exponent or a pointer pointing to the memory associated with the current exponent.

In one embodiment, the encoding method further comprises steps of determining that the memory is full, determining a previously stored value in the memory, overwriting the determined previously stored value in the memory with the current value, and differentially encoding the current value relative to said previously stored value. The encoded data comprises in this case both, a reference pointing to the storage position and a differential value. In one embodiment, also a coding mode indication is included, indicating that the value is a differential value. In another embodiment, the value can in another manner be recognized to be a differential value. If separate memories are used for different exponents, the steps refer to the memory that is associated with the current exponent.

According to another aspect of the invention, a method for decoding encoded floating-point formatted data, wherein the floating-point format comprises at least an exponent and a mantissa, comprises steps of decoding a first encoded floating-point formatted data value, storing the first encoded floating-point formatted data values in a memory of predefined size, detecting an encoded indication of a storage position, decoding said indication, and retrieving a decoded floating-point formatted data value from the memory at said storage position.

In one embodiment of the decoding method, separate memories are used for different exponents, each of the memories being associated with an exponent. The memories need not store exponents explicitly, but only mantissa values or mantissa and sign values, and the step of detecting an encoded indication of a storage position comprises detecting and decoding an encoded indication of a memory that is associated with the exponent of a current data value. The step of retrieving a decoded floating-point formatted data value from the memory refers to mantissa, or to mantissa and sign. The encoded indication of a memory can be e.g. a separate exponent, an indication of the exponent or a pointer pointing to the memory associated with the exponent. The data are read from a memory according to the exponent.

In one embodiment, the decoding method further comprises detecting a differentially encoded value together with an indication of a storage position, differentially decoding a current value from the differentially encoded value and the previously stored value retrieved from the memory, or the memory according to the current exponent (i.e. the memory that is associated with the exponent of the current value), and storing the decoded current value in the memory, or the memory according to the current exponent, at said storage position, thereby overwriting the previously stored value. The differentially encoded value may be recognizable as differentially encoded by a coding mode indication, or in another manner.

According to one aspect of the invention, an encoder for floating-point formatted data comprises a memory having predefined size, first determining means for determining if a current floating-point formatted data value was previously stored in the memory, e.g. by searching and comparing with search means and comparing means, further means for storing the current floating-point formatted data value in the memory if it was not previously stored in said memory, and first encoding means for encoding the current floating-point formatted data value, second determining means for determining the storage position of said value within the memory, if it was previously stored in said memory, and second encoding means for encoding a reference pointing to the storage position.

In one embodiment, the encoder further comprises determining means for determining that the memory is full, determining means for determining a previously stored value in the memory, storage means for overwriting the determined previously stored value in the memory with the current value, and encoding means for differentially encoding the current value relative to said previously stored value. In an embodiment where separate memories are used for different exponents, "the memory" refers to the respective memory that is associated with the current exponent.

According to one aspect of the invention, a decoder for encoded floating-point formatted data comprises first decoding means for decoding first encoded floating-point formatted data value, a memory having predefined size, storage means for storing the first encoded floating-point formatted data values in said memory, indication detection means for detecting an indication of a storage position, and memory access means for retrieving a second decoded floating-point formatted data value from the memory at said storage position.

In one embodiment, the decoder comprises separate memories that are used for different exponents, each of the memories being associated with an exponent, wherein the memories store only mantissa values or mantissa and sign values. Thus, said indication detection means refers to the mantissa, or to mantissa and sign, and said means for retrieving a second decoded floating-point formatted data value from the memory and refers not to all memories, but only to a memory that is associated with the exponent of said current floating-point formatted data value. The decoder further comprises exponent decoding means for decoding a separate exponent, or an indication of the exponent or a pointer pointing to the memory associated with the current exponent, and selection means for selecting the memory according to the exponent.

In one embodiment, the decoder comprises means for detecting a coding mode indication and a differentially encoded value together with an indication of a storage position, decoding means for differentially decoding a current value from said differentially encoded value and the previously stored value retrieved from the memory, and storage means for storing the decoded current value in the memory at said storage position, thereby overwriting the previously stored value. In an embodiment where separate memories are used for different exponents, "the memory" refers to the memory that is associated with the current exponent.

The floating-point format generally comprises at least an exponent and a mantissa. In one embodiment, also a sign is comprised and stored in the memory or memories.

In one embodiment, the encoded signal comprises an indication of the memory size to be used. In one embodiment, the decoder comprises means for determining from the encoded signal the memory size to be used and means for setting the actual memory size to be the determined memory size.

Advantageous embodiments of the invention are disclosed in the dependent claims, the following description and the figures.

BRIEF DESCRIPTION OF THE DRAWINGS

Exemplary embodiments of the invention are described with reference to the accompanying drawings, which show in FIG. 1 how pixels in the texture are mapped to the surface of a triangle in object space.

DETAILED DESCRIPTION OF THE INVENTION

Figure 1:
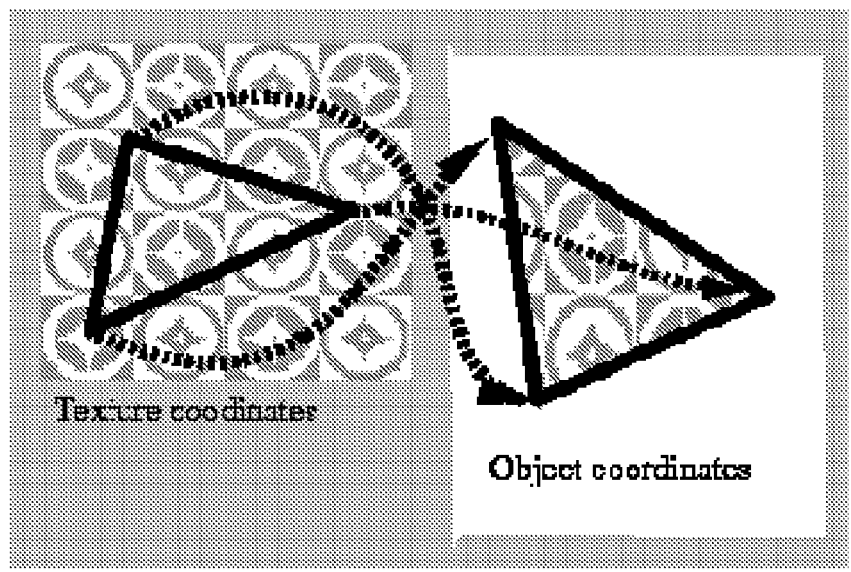
Figure 2:
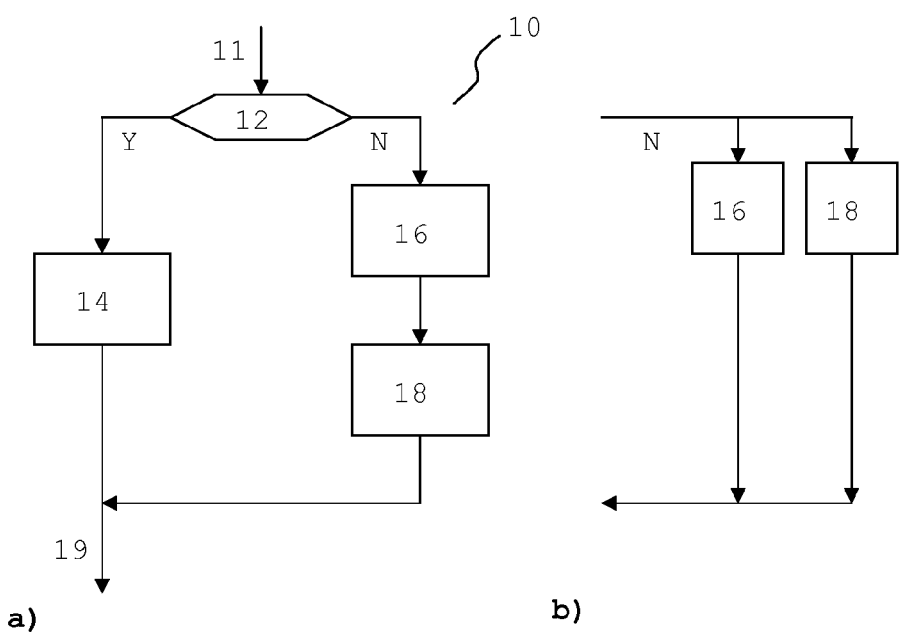
FIG. 2 steps of an encoding method.

FIG. 2 shows method steps according to an embodiment of an encoding framework 10 for encoding floating-point formatted data. A sequence of floating-point values is provided as input 11 to the method. The floating-point format comprises at least an exponent and a mantissa. It may but needs not comprise a sign. A first step is determining 12 for a current floating-point formatted data value if it was previously stored in a memory. If this is not the case, the next step is storing (in said memory) and encoding 16,18 the value. Storing and encoding 16,18 steps are independent from each other and thus may happen simultaneously, or sequentially in any order. The encoding step may comprise conventional encoding of the current floating-point data value.

From the second value of the sequence of input values, it is possible that the same value has already been stored before. Thus, if it is determined 12 that this is the case, then the encoding of the current value comprises an indication, indicating that the current value can be retrieved from the memory and an address, pointer or reference to the storage position. In an embodiment, separate memories are used for different exponents, and the encoding of the current value also comprises an indication of the memory from which the current value can be retrieved (e.g. an indication of the exponent). The encoded current values are output 19 in a sequence.

The step of determining 12 if the current floating-point formatted data value was previously stored in the memory comprises in one embodiment steps of searching through the memory and comparing stored values with the current value. In another embodiment, a separate list of previously stored values may be maintained.

In one embodiment, the range of input values is limited to a pre-defined number of exponents before the encoding. The limiting comprises setting values with an exponent below a threshold to a minimum value, and/or setting values with exponents above a threshold to a maximum value. In one embodiment, the limiting is part of the encoding method. In one embodiment, an encoder comprises corresponding clipping means for limiting the input values correspondingly to a minimum and/or maximum value. In another embodiment, the exponents of the input values are known to be limited in a given range.

The texture coordinates in 3D mesh data have some properties that usually the same floating-point data appear a lot of times. In the proposed coding framework, parallelogram prediction is not used. Instead, the recently appeared floating-point data are stored in a buffer, so that it can be referred to for encoding upcoming floating-point data. If new floating-point data comes that has the same exponent and mantissa, then only the index in the buffer is encoded.

In one embodiment, if the memory is full and new floating-point data comes that has the same exponent but different mantissa as a previous value, the index with the minimum absolute difference is determined, and the difference in the mantissas is encoded. Then the buffer is updated with the new floating-point data mantissa.

As an example, a portion of coordinate data from a real 3D mesh model is given in Tab. 2.

TABLE 2

Texture coordinates of a 3D model ("Viewing Room")

| A | Texture Coordinate X | Texture Coordinate Y |
|---|---|---|
| 1 | 0.9799999594688416 | 0.3758198618888855 |
| 2 | 0.0199999995529652 | 0.3758198618888855 |
| 3 | 0.9799999594688416 | 0.3674575090408325 |
| 4 | 0.9799999594688416 | 0.9800000190734863 |
| 5 | 0.0199999995529652 | 0.9800000190734863 |
| 6 | 0.0199999995529652 | 0.7458561658859253 |
| 7 | 0.9799999594688416 | 0.9800000190734863 |
| 8 | 0.0199999995529652 | 0.7458561658859253 |
| 9 | 0.9799999594688416 | 0.7458561658859253 |
| 10 | 0.9799999594688416 | 0.4263444542884827 |
| 11 | 0.7458561062812805 | 0.4263444542884827 |
| 12 | 0.9799999594688416 | 0.4179821610450745 |
| 13 | 0.0199999995529652 | 0.3758198618888855 |
| 14 | 0.0199999995529652 | 0.3674575090408325 |
| 15 | 0.9799999594688416 | 0.3674575090408325 |
| 16 | 0.0199999995529652 | 0.4690283536911011 |
| 17 | 0.9799999594688416 | 0.4690283536911011 |
| 18 | 0.0199999995529652 | 0.7031722068786621 |
| 19 | 0.7458561062812805 | 0.4011406302452087 |
| 20 | 0.9799999594688416 | 0.4011406302452087 |
| 21 | 0.7458561062812805 | 0.4095029234886169 |
| 22 | 0.7458561062812805 | 0.4095029234886169 |
| 23 | 0.9799999594688416 | 0.4011406302452087 |
| 24 | 0.9799999594688416 | 0.4095029234886169 |
| 25 | 0.0199999995529652 | 0.3926613926887512 |
| 26 | 0.0199999995529652 | 0.3842990994453430 |
| 27 | 0.9799999594688416 | 0.3842990994453430 |
| 28 | 0.0199999995529652 | 0.3926613926887512 |
| 29 | 0.9799999594688416 | 0.3842990994453430 |
| 30 | 0.9799999594688416 | 0.3926613926887512 |
| 31 | 0.7458561062812805 | 0.4263444542884827 |
| 32 | 0.7458561062812805 | 0.4179821610450745 |
| 33 | 0.9799999594688416 | 0.4179821610450745 |
| 34 | 0.9799999594688416 | 0.4690283536911011 |
| 35 | 0.9799999594688416 | 0.7031722068786621 |
| 36 | 0.0199999995529652 | 0.7031722068786621 |
| 37 | 0.9799999594688416 | 0.2932887077331543 |
| 38 | 0.0199999995529652 | 0.2932887077331543 |
| 39 | 0.9799999594688416 | 0.2665293812751770 |
| 40 | 0.9799999594688416 | 0.9800000190734863 |
| 41 | 0.0199999995529652 | 0.9800000190734863 |
| 42 | 0.0199999995529652 | 0.7458559870719910 |
| 43 | 0.9799999594688416 | 0.9800000190734863 |
| 44 | 0.0199999995529652 | 0.7458559870719910 |
| 45 | 0.9799999594688416 | 0.7458559870719910 |
| 46 | 0.9799999594688416 | 0.4190710186958313 |

TABLE 2-continued

Texture coordinates of a 3D model ("Viewing Room")

| A | Texture Coordinate X | Texture Coordinate Y |
|---|---|---|
| 47 | 0.7458559274673462 | 0.4190710186958313 |
| 48 | 0.9799999594688416 | 0.3923116922378540 |
| 49 | 0.0199999995529652 | 0.2932887077331543 |
| 50 | 0.0199999995529652 | 0.2665293812751770 |

In one embodiment, the data are encoded as described in the following. The data pairs of X and Y coordinate are input to the encoder. While the description of the following steps refers to X coordinates only, they may be performed for X and Y coordinates in the same manner. In the first step, an input value of 0.9799999594688416 is received. Note that although the values are written in text form here, they are actually represented in conventional floating-point format, as described above. That is, the first input value will be represented by a mantissa of $s_1$=9.799999594688416 and an exponent of −1. Due to the above-mentioned bias of 127, the exponent is e=126. The mantissa may be truncated or rounded e.g. after 24 bits to $s_{1t}$=9.79999 or $s_{1r}$=9.80000. The mantissa of the first input value is stored in a memory under a first position. The first position comprises an address A1 (e.g. 1 for the first value of the sequence) and may include a separate memory P126 that is only for values of the current exponent e=126. Further, the first input value is also encoded for being output.

The second input value is different from the first, namely 0.0199999995529652. It is represented in floating-point format as $s_2$=1.99999995529652 (may be truncated to $s_{2t}$=1.9999999 or rounded to $s_{2r}$=2.00000) and e=125 (corresponding to an exponent of −2). The encoding comprises determining that the current value is different from the previously stored values, thereupon storing the value in a memory under a second storage position and conventionally encoding the value. The second storage position may comprise a separate memory, e.g. a memory P125 that is used only for values with exponents of e=125 and a respective address A2 in said memory, e.g. A2=1. Also the second input value is conventionally encoded for being output.

The third input value from the sequence of X coordinates is identical to the first one, and can therefore be advantageously encoded according to one aspect of the invention.

The third input value is again represented by a mantissa of $s_3$=9.799999594688416 (may be truncated or rounded as shown above) and an exponent of e=126, as explained above for the first value. The encoding comprises determining the relevant memory P126 according to the exponent, and determining that an identical value has previously been stored in the memory. Since the determining reveals that the value has been previously stored under address A1 in the memory P126, the third value is encoded by reference to the address A1 and the memory P126 (or the exponent e=126). That is, the encoding may be A1/P126. Equivalently also an indication of the exponent can be encoded, but usually an indication of the memory can be compressed better and is therefore more effective to encode.

For example, in applications where only a range of sixteen different exponents may appear, the memory indication uses only four bits. In applications for 3D mesh models where only a range of eight different exponents may appear, the memory indication uses only three bits. Due to the memory size of considerably less than $2^{24}$ entries, and thus memory address size of considerably less than 24 bits, this encoding uses less than the 32 bits of conventional encoding.

Typical memory size may be $2^6$-$2^{12}$ entries, corresponding to 6-12 bits address size per exponent. An exemplary encoded value has therefore 1 bit flag (indication of the encoding method), 3 bits exponent indication and 8 bits address, resulting in 12 bits per value.

As Tab. 2 shows, the value of the first entry of the X coordinates is repeated several times. The same applies to other X coordinates and also to the values of the Y coordinates. This is typical for many 3D mesh models, which often have very regular structures. Further, a limited precision of e.g. 8 bytes is sufficient for mantissas of coordinate values, since more detail cannot be perceived by a viewer and is therefore irrelevant.

Figure 3:
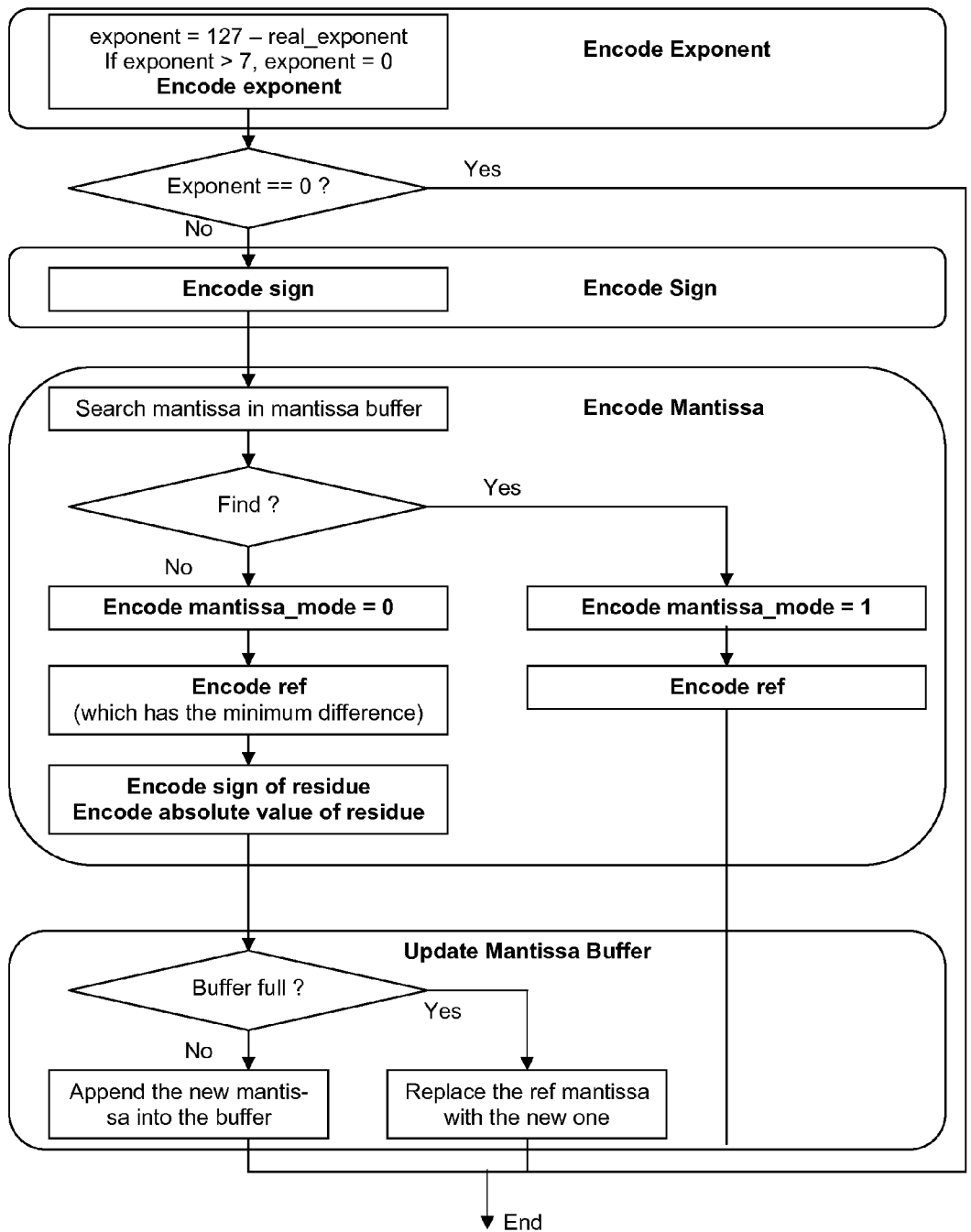
FIG. 3 steps of an encoding method in one embodiment.

In FIG. 3 the coding method according to one embodiment of the invention is depicted. First, the exponent of a current input value is encoded. For this purpose, an exponent bias of 127 is subtracted from the actual exponent. If the remainder is larger than 7, the value is too large and therefore ignored. Otherwise, the sign and the mantissa are encoded. For encoding the mantissa, the first step is searching it in a memory. If the mantissa was previously stored, it is found, and the value is encoded as described above. In this case, the encoded value comprises a flag mantissa mode being set to 1, the storage address and the memory indication from which the value can be retrieved. If the mantissa was not previously stored, the flag mantissa mode is set to 0 and another value is searched in the memory (i.e. the memory that is associated with the current exponent), namely the value $s_{cls}$ that has the minimum difference against the current mantissa. The closest stored mantissa value $s_{cls}$ is determined, and a residual is calculated. The residual is the difference between the closest stored mantissa value $s_{cls}$ and the current mantissa value (referring to the table of the current exponent). In one embodiment, the residual is a floating-point value and can be positive or negative. In the next step, the sign, the mantissa and the exponent of the residual are encoded. In one embodiment, the residual is only encoded if it is smaller than a threshold value, or if its exponent is smaller than an exponent threshold value.

Then, the mantissa memory (of the current exponent) is updated. In one embodiment, the memories are large (e.g. $2^{12}$ entries) and once a memory is full, no more values are written to the memory. In another embodiment, the memories may be smaller, and if a memory is full, a previously stored mantissa value is replaced with the current mantissa value. This prevents overflow and enables usage of small buffers. In one embodiment, the above-mentioned closest stored mantissa value $s_{cls}$ is replaced with the current mantissa value. If the mantissa memory is not full, the current mantissa value is only appended.

The encoded value according to one embodiment comprises an encoded exponent, which is simultaneously an indication of the mantissa memory to be used, a sign, an encoding mode indication mantissa mode, a residue indication, a residue sign and a residue. In one embodiment the encoded value comprises no sign, since all input values are defined to be positive.

Figure 4:
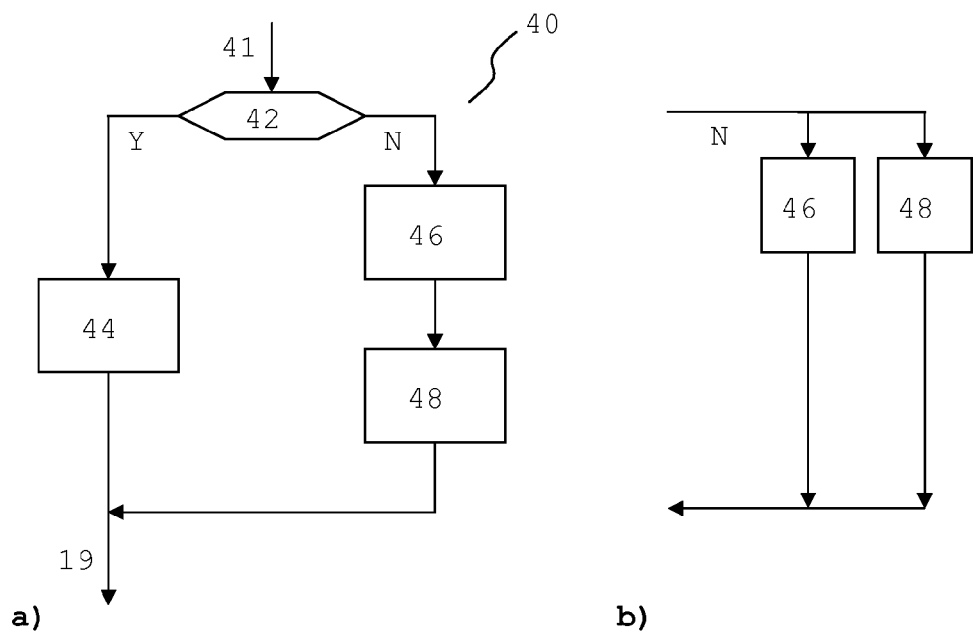
FIG. 4 steps of a decoding method.
Figure 5:
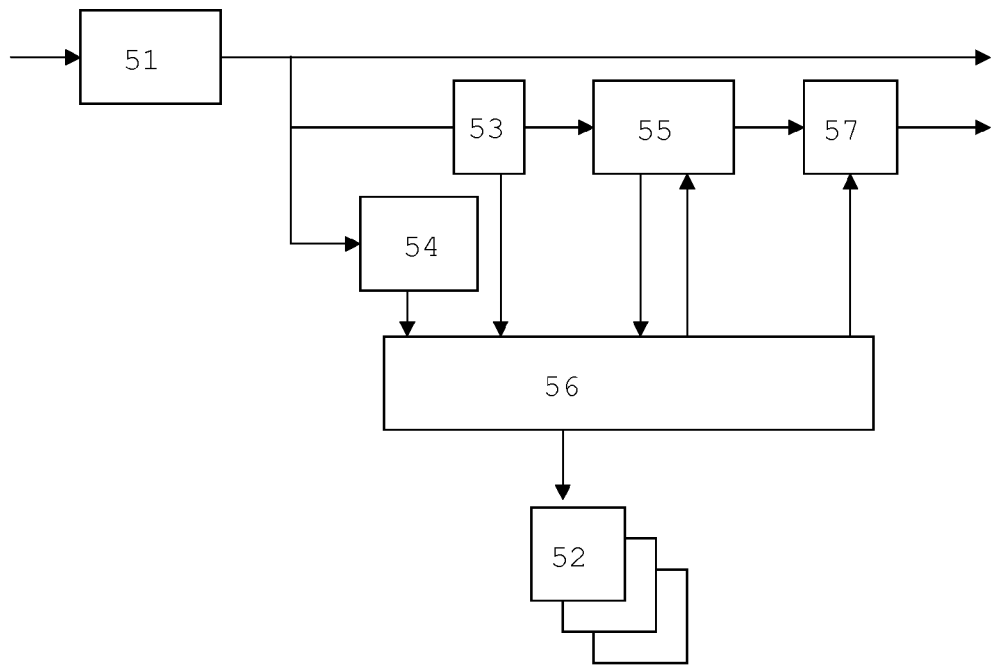
FIG. 5 a decoder according to one embodiment.

FIG. 4 shows an exemplary method for decoding 40. A sequence of encoded input values 41 is received. For each value, its exponent and an encoding mode indication mantissa_mode is determined 42. If the indication indicates a first mode (e.g. conventional format mode), the received value is conventionally decoded and its mantissa is stored in a buffer 46, 48 according to the determined exponent. Otherwise, if the indication indicates a second mode (e.g. mantissa mode), a portion of the received value is interpreted as a memory address, and the actual mantissa value is retrieved 44 from the memory address of the memory that is associated with the exponent. The steps of conventionally decoding the received value and storing its mantissa in a buffer 46,48 are independent from each other, and may be performed in any sequential order, or simultaneously as shown in FIG. 4*b*).

Since a decoder takes the same decisions as an encoder for storing values in a buffer or retrieving values from a buffer, and the buffers have pre-defined size and are therefore simultaneously full, the buffer filling of the decoder is an exact copy of the encoders buffer filling at any particular stage of the encoding/decoding process.

In one embodiment, no more values are written to the buffer when a buffer is full. In this embodiment, the buffers may preferably be large (e.g. $2^{12}$ entries).

In another embodiment, buffer entries may be updated. In this embodiment, the decoding method comprises further steps of detecting a residual mode indication, a floating-point value and a sign together with the mantissa mode indication, and thereupon interpreting the floating-point value and the sign as a residual. Then a value is retrieved from the memory, as in mantissa mode, and the residual is added to the retrieved value. The resulting sum is the output value, i.e. the decoded coordinate value. Further, the decoded coordinate value is also stored in the memory under the current address, replacing the previously retrieved value. An advantage of this embodiment is that the buffers may have relatively few entries, e.g. $2^6$, since equal values may tend to appear close to each other, e.g. if a 3D mesh model description proceeds region-by-region.

Storing values in a buffer and retrieving values from a buffer is synchronized in the encoder and the decoder, i.e. corresponding buffers are available and the buffers have the same data in corresponding entries. This is ensured by performing in the decoder steps corresponding to those of the encoder: the input values are stored in a memory as long as the memory is not full, and replaces 44 previously stored values if the memory is full.

Note that the different memories that are associated with the different exponents may also be implemented as different regions of predefined size within one memory.

Since the encoder and decoder need to synchronize their memory usage, i.e. deciding whether or not the memory is full, the memory has a predefined size (i.e. number of entries). In one embodiment, the memory size that is used in the encoder is transmitted to the decoder, so that the decoder may determine the required memory size and set up its memory accordingly (assuming that the decoder has more memory available than required).

In Tab. 3, an exemplary syntax of a bitstream as usable in H.264/AVC is described.

TABLE 3

Bitstream syntax of texture coordinates

| | Descriptor |
|---|---|
| texture_coordinate ( ) { | |
|   for( i=0; i<2; i++) { | |
|     exponent[i] | ae(v) |
|     if (exponent[i] == 0) { | |
|       float_point_data = 0x0000 0000 0000 0000 | |
|     } | |
|     else { | |
|       sign[i] | ae(v) |
|       mantissa_mode[i] | ae(v) |
|       ref[i] | ae(v) |
|       if (mantissa_mode[i] ) { | |
|         mantissa[i] = buff[i][exponent[i]−1][ref[i]] | |
|       } | |
|     else { | |

TABLE 3-continued

Bitstream syntax of texture coordinates

| | Descriptor |
|---|---|
| texture_coordinate ( ) { | |
|       mantissa_sign[i] | ae(v) |
|       mantissa_residue[i] | ae(v) |
|       mantissa[i]= | |
|         mantissa_sign[i]*mantissa_residue[i]+ | |
|         buff[i][exponent[i]−1][ref[i]] | |
|       updata_buffer(i, exponent[i], ref[i], mantissa[i]) | |
|     } | |
|     float_point_data = (sign[i]<<31) | (127− | |
|     expoinent[i])<<23 | mantissa[i] | |
|   } | |
| } | |
| } | |

In Tab. 3, ae(v) stands for arithmetic encoding, similar to the arithmetic coding in H.264/AVC.

In an exemplary embodiment, semantics of a bitstream are as follows:

exponent[i] can be used to get the real exponent of floating-point data texture coordinates, e.g. i=0 for x, and i=1 for y. In 3D mesh coding, all the texture coordinates are scaled into [0, . . . , 1], so that the real exponents are always smaller than 127 but close to 127. Therefore, we set 127 minus real_exponent as exponent[i]. If the real exponent is smaller than 120, the exponent and the floating point data are set as zero, since it is too small. Consequently, 3 bits are used to indicate the exponent[i] as follows:

Exponent=127−real_exponent (if real_exponent≥120 && real_exponent<127)

Exponent=0 (Otherwise)

TABLE 4

Real_exponent and exponent

| Real_Exponent | Exponent (3 bits) |
|---|---|
| 126 | 1 |
| 125 | 2 |
| 124 | 3 |
| 123 | 4 |
| 122 | 5 |
| 121 | 6 |
| 120 | 7 |
| 0-119 | 0 | sign[i] is a 1-bit sign of the floating-point data texture coordinates. Usually a 0 indicates a positive value. mantissa_mode[i] is a 1-bit flag. When mantissa mode is 1, real_mantissa is the data stored in a buffer with a reference index. When the mantissa mode is 0, real_mantissa is the data stored in a buffer with a reference index, plus a decoded mantissa residue.

ref[i] is an address with $\log_2$(buffer_size) bits, namely the index of the reference mantissa in the buffer.

mantissa_sign[i] is a 1-bit flag to indicate the sign of the mantissa residue.

mantissa_residue[i] is a 23-bit floating-point value to indicate the residue between the real mantissa and the reference mantissa in the buffer.

TABLE 5

Procedure for updating the mantissa buffer

| update_buffer (i, exponent[i], ref[i], mantissa[i] ) { | Descriptor |
|---|---|
|     for ( j=0; j<buffer_size; j++) { <br>         if ( buff[i][exponent[i]−1][j] == 0 ) { <br>             buff[i][exponent[i]−1][j] = mantissa[i] <br>             break <br>         } <br>         if ( j == buffer_size ) <br>             buff[i][exponent[i]−1][ref[i]] = mantissa[i] <br>     } <br> } | |

Tab.5 shows an exemplary procedure for updating the mantissa memory. The buffers in encoder and decoder are updated in the same way. For a current value i, its exponent, reference address ref and mantissa residue, the buffer associated with the exponent exp[i] is searched through entry-by-entry and the mantissas are compared.

A buffer size analysis done by the inventors reveals only little memory space is required. In this embodiment, there are two buffers, one for x and the other for y. For each buffer, there are 7 exponents (120, . . . , 126) for which mantissa values need to be stored. Exemplarily 24 bits (3 bytes) are used to store each mantissa, and altogether 64 mantissas are stored per exponent. Therefore, the buffer size required is 2×7×64×3=2688 Bytes=2.625 kB Anyway, in a different application scenario, buffer size can be changed accordingly. For example, the number of stored mantissas for each exponent are powers of 2 (e.g. 8, 32, 128, 256), or another number.

The buffer updating scheme can also be designed differently. In one embodiment, if for a current mantissa the same value is not found in the buffer and the buffer is full, then a different update scheme can be described as follows: Determine (e.g. by using some counting method) which mantissa in the buffer is the oldest. Then the new mantissa will replace the oldest one, rather than replacing the mantissa with the smallest absolute difference. This is more effective, since frequently used mantissas are maintained longer, but requires some more processing effort.

The present invention exploits the redundancy lying in 3D mesh texture coordinates, and proposes an effective entropy coding scheme for floating-point data. It is particularly advantageous for texture coordinates, since they often have the characteristic that the same floating-point data will appear a lot of times. This may be due to regular structures in such 3D mesh models. Therefore, parallelogram prediction is not used in the disclosed coding framework. Instead, recently used floating-point data are stored in a buffer memory, so that they can serve as references for encoding and decoding upcoming floating-point data. If new floating-point data comes that has the same exponent and mantissa, then only the index in the buffer memory and an indication of the memory is encoded. Otherwise, in one embodiment the index with the minimum absolute difference and the difference of the mantissa are encoded, and the buffer is updated with the new floating-point data.

The memory size of the encoder is an important parameter for some aspects of the invention. Therefore the memory size that is used in the encoder may be transmitted to the decoder, and if the decoder has more memory space available, it may set up its memory accordingly to use only the indicated number of entries. In one embodiment, the memory size is defined by convention, and is equal in the encoder and the decoder.

An encoder is described above. In one embodiment, an encoder further comprises determining means for determining that the memory, or the memory associated with the current exponent, is full; determining means for determining a previously stored value in the memory, or in the memory associated with the current exponent; storage means for overwriting the determined previously stored value in the memory, or in the memory associated with the current exponent, with the current value; and encoding means for differentially encoding the current value relative to said previously stored value.

A decoder is described above. In one embodiment, a decoder further comprises means for detecting a coding mode indication and a differentially encoded value together with an indication of a storage position; decoding means for differentially decoding a current value from said differentially encoded value and the previously stored value retrieved from the memory according to the current exponent (i.e. the memory that is associated with the exponent of the current value); and storage means for storing the decoded current value in the memory according to the current exponent (i.e. the memory that is associated with the exponent of the current value) at said storage position, thereby overwriting the previously stored value.

The invention is applicable to various applications that compress floating-point data. In particular, the invention is advantageous for applications that use and compress floating-point data for 3D objects, including e.g. gaming, engineering design, architectural walkthrough, e-commerce, virtual reality and scientific visualization.

While there has been shown, described, and pointed out fundamental novel features of the present invention as applied to preferred embodiments thereof, it will be understood that various omissions and substitutions and changes in the apparatus and method described, in the form and details of the devices disclosed, and in their operation, may be made by those skilled in the art without departing from the spirit of the present invention. Although the present invention has been disclosed with regard to floating-point data of 3D mesh models, one skilled in the art would recognize that the method and devices described herein may be applied to any application that uses, encodes or decodes floating-point data. It is expressly intended that all combinations of those elements that perform substantially the same function in substantially the same way to achieve the same results are within the scope of the invention. Substitutions of elements from one described embodiment to another are also fully intended and contemplated. The present invention has been described purely by way of example, and modifications of detail can be made without departing from the scope of the invention. Each feature disclosed in the description and (where appropriate) the claims and drawings may be provided independently or in any appropriate combination. Features may, where appropriate be implemented in hardware, software, or a combination of the two. Reference numerals appearing in the claims are by way of illustration only and shall have no limiting effect on the scope of the claims.

The invention claimed is:

1. A method for encoding floating-point formatted data, wherein the floating-point format comprises at least an exponent and a mantissa and wherein the floating-point formatted data are geometry data of a 3D mesh model and comprise texture coordinates, the method comprising steps of:

determining if a current floating-point formatted data value was previously stored in a memory being one of a plurality of separate memories, each of the separate memories having predefined size, wherein separate the separate memories are used for different exponents and each of the memories is associated with an exponent, and wherein the current floating-point formatted data value has a current exponent and a current mantissa;

if the current floating-point formatted data value was not previously stored in said memory, storing it in the memory used for the current exponent, and encoding it;

otherwise, determining the storage position of said value within the memory used for the current exponent, and encoding a reference pointing to the storage position; and encoding the exponent, an indication of the exponent or a pointer pointing to the memory associated with the current exponent; wherein said steps of determining if a current value was previously stored in a memory, storing the value in the memory and determining the storage position refer only to a memory that is associated with the exponent of said current floating-point formatted data value and refer to mantissa, or to mantissa and sign.

2. A method according to claim 1, further comprising steps of determining that the memory associated with the current exponent is full;

determining a previously stored value in the memory associated with the current exponent;

overwriting, in the memory associated with the current exponent, the determined previously stored value with the current value; and differentially encoding the current value relative to said previously stored value.

3. A method according to claim 2, wherein the step of determining a previously stored value comprises determining, from among a plurality of previously stored values, the stored value that has minimum absolute difference of mantissa with a current mantissa.

4. A method according to claim 1, wherein separate memories are used for each dimension of the coordinates.

5. A method according to claim 1, wherein the texture coordinates comprised in the floating-point formatted data are uncompressed.

6. A method according to claim 1, further comprising a step of pre-analyzing the floating-point formatted data, and storing only those values that are repeated within a predefined amount of data.

7. A method according to claim 1, wherein floating-point values with exponents below a minimum, and/or floating-point values with exponents above a maximum, are encoded as default values, wherein a reduced number of bits of the exponent is stored, encoded or decoded.

8. A method according to claim 1, wherein the step of storing the floating-point formatted data value in the memory comprises overwriting a previously stored floating-point formatted data value, and wherein the encoding comprises differential encoding relative to the previously stored value.

9. The method according to claim 1, further comprising steps of determining a previously stored value in the memory associated with the current exponent;

overwriting, in the memory associated with the current exponent, the determined previously stored value with the current value; and differentially encoding the current value relative to said previously stored value.

10. The method according to claim 9, wherein the step of determining if a current floating-point formatted data value was previously stored in a memory comprises determining if a difference between the current floating point formatted data value and a previously stored value is more than a threshold, and wherein said overwriting the previously stored floating-point formatted data value is only performed if the determined difference is more than a threshold, and wherein a separate indication is encoded, the separate indication indicating the overwriting of the previously stored floating-point formatted data value.

11. A method for decoding encoded floating-point formatted data, wherein the floating-point format comprises at least an exponent and a mantissa and wherein the floating-point formatted data are geometry data of a 3D mesh model and comprise texture coordinates, the method comprising steps of decoding a first encoded floating-point formatted data value;

storing the first encoded floating-point formatted data values in a memory having predefined size, wherein separate memories are used for different exponents, and each of the memories is associated with an exponent;

detecting an indication of a storage position;

retrieving a second decoded floating-point formatted data value from the memory at said storage position; and decoding a separate exponent, an indication of the exponent or a pointer pointing to the memory associated with the current exponent, and selecting the memory according to the exponent;

wherein said steps of storing the first encoded floating-point formatted data values and detecting an indication of a storage position refer only to a memory that is associated with the exponent of said current floating-point formatted data value, and wherein the step of retrieving a second decoded floating-point formatted data value refers to mantissa, or to mantissa and sign.

12. A method according to claim 11, further comprising steps of detecting a coding mode indication and a differentially encoded value together with an indication of a storage position;

differentially decoding a current value from said differentially encoded value and the previously stored value retrieved from the memory according to the current exponent; and storing the decoded current value in the memory according to the current exponent at said storage position, thereby overwriting the previously stored value.

13. The method according to claim 11, wherein floating-point values with exponents below a minimum, and/or floating-point values with exponents above a maximum, are encoded as default values, wherein a reduced number of bits of the exponent is stored, encoded or decoded.

14. The method according to claim 11, wherein the step of storing the floating-point formatted data value in the memory comprises overwriting a previously stored floating point formatted data value, and wherein the encoding comprises differential encoding relative to the previously stored value.

15. Encoder for encoding floating-point formatted data, wherein the floating-point format comprises at least an exponent and a mantissa, the encoder comprising a plurality of separate memories having predefined size that are used for different exponents, each of the memories being associated with an exponent;

first determining unit configured to determine if a current floating-point formatted data value was previously stored in a memory associated with the exponent of said current data value;

storage configured to store the current floating-point formatted data value in the memory, if it was not previously stored in said memory, and first encoder configured to encode the current floating-point formatted data value;

second determining unit configured to determine the storage position of said value within the memory, if it was previously stored in said memory, and second encoding means for encoding a reference pointing to the storage position; and third encoder configured to encode the exponent, an indication of the exponent or a pointer pointing to the memory associated with the current exponent;

wherein said first determining unit, said storage adapted to store the value in the memory and said second determining unit refer only to a memory that is associated with the exponent of said current floating-point formatted data value and refer to mantissa, or to mantissa and sign.

16. The encoder according to claim 15, wherein the storage configured to store the current floating-point formatted data value in said memory associated with the exponent of the current floating-point formatted data value is further configured to determine a previously stored value in the memory; and overwrite in the memory the determined previously stored value with the current value, wherein the first encoding means performs differential encoding of the current value relative to said previously stored value.

17. The encoder according to claim 15, further comprising determining unit configured to determine, before the current floating-point formatted data value is stored in said memory, that the memory associated with the current exponent is full, wherein said determining a previously stored value in the memory and said overwriting the value are executed only if the memory is full.

18. Decoder for encoded floating-point formatted data, wherein the floating-point format comprises at least an exponent and a mantissa and wherein the floating-point formatted data are geometry data of a 3D mesh model and comprise texture coordinates, comprising first decoder configured to decode a first encoded floating-point formatted data value;

a plurality of separate memories, each having predefined size;

storage configured to store the first encoded floating-point formatted data values in one of said memories, wherein separate memories are used for different exponents, each of the memories being associated with an exponent;

indication detector configured to detect an indication of a storage position;

memory access unit configured to retrieve a second decoded floating-point formatted data value from a memory at said storage position; and exponent decoder configured to decode a separate exponent, an indication of the exponent or a pointer pointing to the memory associated with the current exponent, and selection means for selecting the memory according to the exponent;

wherein at least said indication detector and the memory access unit refer only to a memory that is associated with the exponent of said current floating-point formatted data value.

19. The decoder according to claim 18, further comprising memory access unit configured to retrieve a second decoded floating-point formatted data value from the memory or memory region at said storage position;

differential decoder configured to differentially decode a current value from said differentially encoded value and the previously stored value retrieved from the memory or memory region according to the current exponent; and storage configured to store the decoded current value in the memory or memory region according to the current exponent at said storage position, thereby overwriting the previously stored value.

20. The decoder according to claim 18, further comprising determining unit configured to determine that the memory or memory region associated with the current exponent is full, wherein said storing the decoded current value in the memory or memory region according to the current exponent at said storage position is performed upon said detecting that the memory or memory region associated with the current exponent is full.

21. Encoder for encoding floating-point formatted data, wherein the floating-point format comprises at least an exponent and a mantissa, the encoder comprising a plurality of separate memories having predefined size that are used for different exponents, each of the memories being associated with an exponent;

first determining means for determining if a current floating-point formatted data value was previously stored in a memory associated with the exponent of said current data value;

means for storing the current floating-point formatted data value in the memory, if it was not previously stored in said memory, and first encoding means for encoding the current floating-point formatted data value;

second determining means for determining the storage position of said value within the memory, if it was previously stored in said memory, and second encoding means for encoding a reference pointing to the storage position; and third encoding means for encoding the exponent, an indication of the exponent or a pointer pointing to the memory associated with the current exponent;

wherein said first determining means, said means for storing the value in the memory and said second determining means refer to a memory that is associated with the exponent of said current floating-point formatted data value and refer to mantissa, or to mantissa and sign.

22. The encoder according to claim 21, wherein the means for storing the current floating-point formatted data value in said memory associated with the exponent of the current floating-point formatted data value further performs determining a previously stored value in the memory; and overwriting in the memory the determined previously stored value with the current value, wherein the first encoding means performs differential encoding of the current value relative to said previously stored value.

23. The encoder according to claim 21, further comprising determining means for determining, before the current floating-point formatted data value is stored in said memory, that the memory associated with the current exponent is full, wherein said determining a previously stored value in the memory and said overwriting the value are executed only if the memory is full.

24. Decoder for encoded floating-point formatted data, wherein the floating-point format comprises at least an exponent and a mantissa and wherein the floating-point formatted data are geometry data of a 3D mesh model and comprise texture coordinates, comprising first decoder means for decoding a first encoded floating-point formatted data value;

a plurality of separate memories, each having predefined size;

storage means for storing the first encoded floating-point formatted data values in one of said memories, wherein separate memories are used for different exponents, each of the memories being associated with an exponent;

indication detection means for detecting an indication of a storage position;

memory access means for retrieving a second decoded floating- point formatted data value from memory at said storage position; and exponent decoding means for decoding a separate exponent, an indication of the exponent or a pointer pointing to the memory associated with the current exponent, and selection means for selecting the memory according to the exponent;

wherein at least said indication detection means and the means for retrieving a second decoded floating point formatted data value from the memory refer only to a memory that is associated with the exponent of said current floating-point formatted data value.

25. The decoder according to claim 24, further comprising memory access means for retrieving a second decoded floating-point formatted data value from the memory or memory region at said storage position;

differential decoder for differentially decoding a current value from said differentially encoded value and the previously stored value retrieved from the memory or memory region according to the current exponent; and storage means for storing the decoded current value in the memory or memory region according to the current exponent at said storage position, thereby overwriting the previously stored value.

26. The decoder according to claim 24, further comprising determining means for determining that the memory or memory region associated with the current exponent is full, wherein said storing the decoded current value in the memory or memory region according to the current exponent at said storage position is performed upon said detecting that the memory or memory region associated with the current exponent is full.

* * * * *